(12) United States Patent
Taschner et al.

(10) Patent No.: US 10,886,644 B2
(45) Date of Patent: Jan. 5, 2021

(54) METHOD FOR CONTACTING A CONTACT SURFACE ON A FLEXIBLE CIRCUIT WITH A METAL CONTACT, CRIMPING PART, CONNECTION OF FLEXIBLE CIRCUIT AND METAL CONTACT AND CONTROL DEVICE

(71) Applicant: CPT Zwei GMBH, Hannover (DE)

(72) Inventors: Nikolaus Taschner, Bayreuth (DE); Tilo Liebl, Hersbruck (DE)

(73) Assignee: Vitesco Technologies Germany GmbH, Hannover (DE)

( * ) Notice: Subject to any disclaimer, the term of this patent is extended or adjusted under 35 U.S.C. 154(b) by 0 days.

(21) Appl. No.: 16/436,680

(22) Filed: Jun. 10, 2019

(65) Prior Publication Data

US 2019/0296464 A1 Sep. 26, 2019

Related U.S. Application Data

(63) Continuation of application No. PCT/EP2017/082355, filed on Dec. 12, 2017.

(30) Foreign Application Priority Data

Dec. 22, 2016 (DE) .................. 10 2016 225 973

(51) Int. Cl.
*H01R 12/58* (2011.01)
*H01R 12/59* (2011.01)
(Continued)

(52) U.S. Cl.
CPC ......... *H01R 12/585* (2013.01); *H01R 12/592* (2013.01); *H01R 12/65* (2013.01);
(Continued)

(58) Field of Classification Search
CPC .... H01R 12/585; H01R 12/592; H01R 12/65; H01R 12/69; H05K 1/118; H05K 2201/10303; H05K 2201/1031; H05K 2201/1034; H05K 2201/1059; H05K 2201/2009
(Continued)

(56) References Cited

U.S. PATENT DOCUMENTS 3,028,573 A * 4/1962 Stoehr .................. H05K 1/0289
439/48
3,713,072 A * 1/1973 Henschen .............. H01R 4/182
439/425

(Continued)

FOREIGN PATENT DOCUMENTS

DE 10100189 A1 7/2001
DE 102006055023 A1 5/2007
(Continued)

OTHER PUBLICATIONS

Japanese Notice of Reasons for Refusal drafted May 22, 2020 for the counterpart Japanese Patent Application No. 2019-534085.

*Primary Examiner* — Harshad C Patel

(57) ABSTRACT

The disclosure relates to a method for contacting a contact surface on a flexible circuit board with a metal contact outside the flexible circuit board, with the aid of a press-fit pin. An attachment piece having a sleeve for receiving the press-fit pin is a mechanically and electrically coupled to the flexible circuit board.

10 Claims, 3 Drawing Sheets

(51) Int. Cl.
*H01R 12/69* (2011.01)
*H05K 1/11* (2006.01)
*H01R 12/65* (2011.01)
*H05K 3/30* (2006.01)

(52) U.S. Cl.
CPC ............ *H01R 12/69* (2013.01); *H05K 1/118* (2013.01); *H05K 3/306* (2013.01); *H05K 2201/1031* (2013.01); *H05K 2201/1034* (2013.01); *H05K 2201/1059* (2013.01); *H05K 2201/10303* (2013.01); *H05K 2201/2009* (2013.01); *Y02P 70/50* (2015.11)

(58) Field of Classification Search
USPC ................................ 439/82, 79, 66, 74, 76.1
See application file for complete search history.

(56) References Cited

U.S. PATENT DOCUMENTS

| | | | |
|---|---|---|---|
| 3,777,301 A | 12/1973 | Michaels | |
| 3,960,430 A * | 6/1976 | Bunnell | H01R 4/2495 439/422 |
| 4,056,299 A * | 11/1977 | Paige | H01R 4/4818 439/439 |
| 4,521,969 A * | 6/1985 | Greenwood | H05K 3/365 33/562 |
| 4,781,621 A * | 11/1988 | Sugiyama | H05K 7/026 174/564 |
| 5,017,145 A * | 5/1991 | Kanai | H02B 1/207 29/850 |
| 5,873,740 A * | 2/1999 | Alcoe | H01R 13/2414 439/493 |
| 6,503,090 B2 * | 1/2003 | Onizuka | H01R 12/58 439/75 |
| 6,623,280 B2 * | 9/2003 | Oldenburg | H01R 12/52 439/590 |
| 6,881,074 B1 * | 4/2005 | McLenaghan | H01R 13/20 257/E23.078 |
| 7,083,431 B1 * | 8/2006 | Darr | H01R 12/585 439/75 |
| 7,085,146 B2 * | 8/2006 | Pitzele | H05K 3/3447 29/852 |
| 7,101,197 B2 * | 9/2006 | Naito | H05K 1/144 439/75 |
| 7,247,031 B2 * | 7/2007 | Naito | H01R 9/2458 439/75 |
| 7,618,283 B1 * | 11/2009 | Costello | H01R 12/585 439/511 |
| 7,736,183 B2 * | 6/2010 | Trout | H01R 13/6471 439/607.1 |
| 7,946,861 B2 * | 5/2011 | Sander | H01R 12/585 439/82 |
| 7,963,796 B2 * | 6/2011 | Sypolt | H01R 12/732 439/511 |
| 8,075,321 B1 * | 12/2011 | Costello | H01R 12/79 439/77 |
| 8,118,611 B2 * | 2/2012 | Jeon | H01R 12/523 439/511 |
| 8,192,207 B2 * | 6/2012 | Iida | H01R 12/52 439/67 |
| 9,153,886 B2 * | 10/2015 | Nastasa | H01R 12/585 |
| 10,199,760 B2 * | 2/2019 | Park | H01R 13/2421 |
| 2005/0245118 A1 * | 11/2005 | Liu | H01R 12/62 439/329 |
| 2009/0233465 A1 * | 9/2009 | Mizoguchi | H01R 12/79 439/74 |
| 2019/0027842 A1 * | 1/2019 | Hashiguchi | H01R 12/79 |

FOREIGN PATENT DOCUMENTS

| | | |
|---|---|---|
| DE | 102010039204 A1 | 2/2012 |
| EP | 00954058 A | 8/2000 |
| JP | S58033656 Y | 7/1983 |
| JP | S63085155 | 6/1988 |
| JP | H05017594 A | 1/1993 |
| JP | H11329628 A | 11/1999 |
| JP | 2002015805 A | 1/2002 |
| JP | 2003203703 A | 7/2003 |
| JP | 2005080354 A | 3/2005 |
| JP | 2013239565 A | 11/2013 |

* cited by examiner

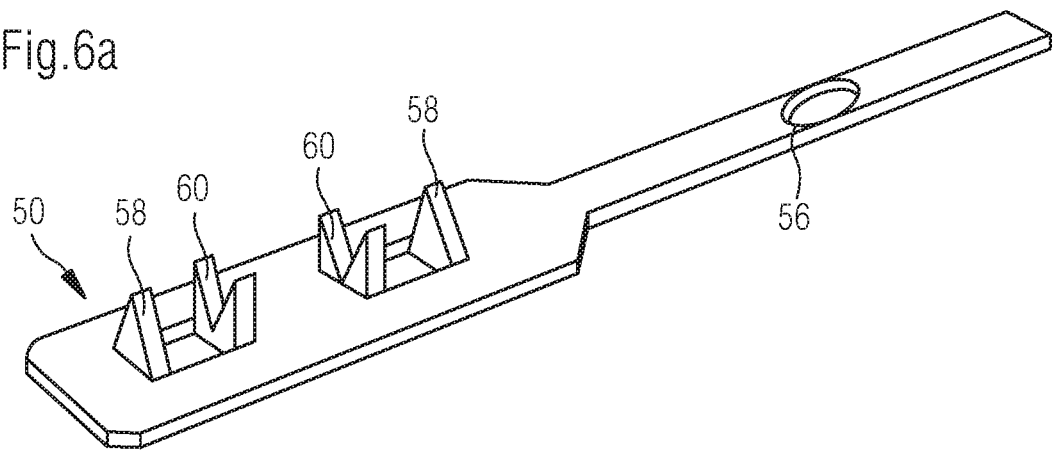
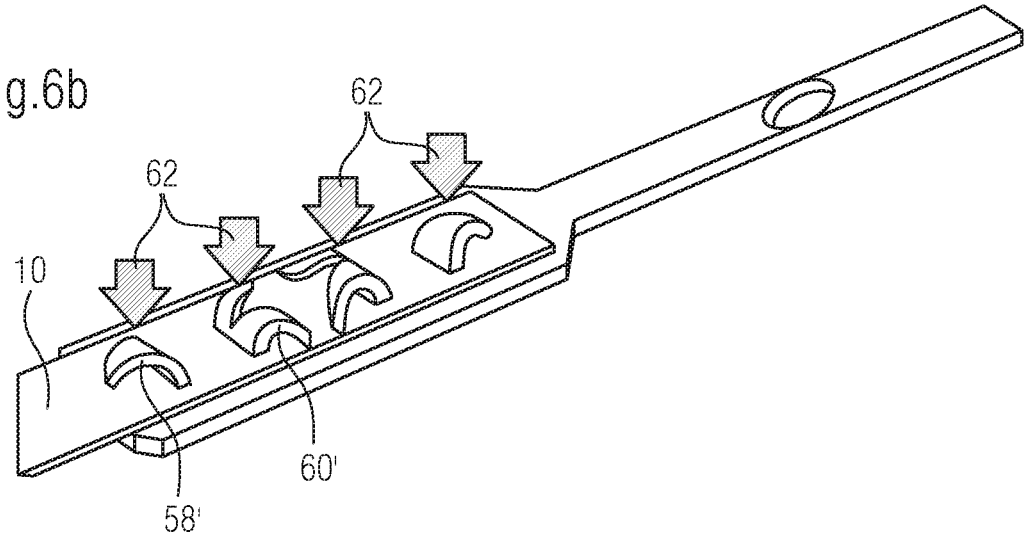

METHOD FOR CONTACTING A CONTACT SURFACE ON A FLEXIBLE CIRCUIT WITH A METAL CONTACT, CRIMPING PART, CONNECTION OF FLEXIBLE CIRCUIT AND METAL CONTACT AND CONTROL DEVICE

CROSS-REFERENCE TO RELATED APPLICATIONS

This application claims the benefit of PCT Application PCT PCT/EP2017/082355, filed Dec. 12, 2017, which claims priority to German application No. 10 2016 225 973.3, file Dec. 22, 2016. The disclosures of the above applications are incorporated herein by reference.

TECHNICAL FIELD

The disclosure relates to a method for contacting a contact surface on a flexible circuit board with a metal contact outside the flexible circuit board. The disclosure also relates to a crimping part. The disclosure furthermore relates to a connection established by a method, and to a control device having such a connection.

BACKGROUND

The use of flexible circuit boards ("flex-PCBs", "PCB" referring to printed circuit board) is particularly necessary in the construction of a control device for a motor vehicle, preferably for a vehicle transmission, so as to meet the environmental conditions as well as the three-dimensional installation space.

The rigid circuit boards ("rigid PCBs") used to date are easy to contact. In order for a contact surface on such a rigid circuit board to be contacted with a metal contact outside the circuit board, typically a contact of a stamped lattice, so-called press-fit pins are conventionally provided. A sleeve, thus a through hole (industrial term used for "through contact" or passage), typically of a circular cross section, into which the press-fit pin is pressed is configured in the circuit board. The press-fit pin in the region of the press-fit zone has elastic properties (for example, eye-of-the-needle geometries, needle-eye shape). The geometry is compressed by being pressed into the sleeve, where the elastic restoring force presses the press-fit pin against the internal wall of the sleeve. The through contact provided there, thus a metal contact, preferably from copper, thus comes into electrical contact with a metallically conductive surface of the press-fit pin such that a conductive connection to the outside, to a neck of the press-fit pin, is provided by way of the latter. A typical thickness of the rigid circuit board for press-fit contact is in the range from 1.5 to 1.8 mm, preferably is 1.6 mm.

A single-tier flexible circuit board has thicknesses of typically 0.25 mm (depending on the construction of films and layers) and is typically formed from a base film to which copper conductor tracks and a cover film are applied. The base film is typically composed of plastics materials such as PEEK (polyether ether ketone), polyester, polyimide, fluoropolymers, or the like.

Flexible circuit boards, because of the flexibility thereof and the minor overall thickness, cannot absorb any spring force of a press-fit pin.

For this reason, contact surfaces on flexible circuit boards to date are connected outside the flexible circuit board by means of laser welding or by means of soldering with the metal contacts. However, both methods have disadvantages.

In the case of laser welding, a local reduction in the strength of the flexible circuit board and the conductor tracks applied thereto arises. Connections by way of selective soldering methods have also been demonstrated to be disadvantageous since the position during the soldering is extremely critical. Subsequent mechanical stresses can lead to the destruction of the soldered joint.

SUMMARY

The disclosure provides an improved method for contacting a contact surface on a flexible circuit board with a metal contact outside the flexible circuit board, the method not having the above-mentioned disadvantages. The disclosure also provides a corresponding connection of, first, a flexible circuit board with, second, a metal contact, and provides a corresponding control device.

One aspect of the disclosure provides a method for contacting a contact surface on a flexible circuit board with a metal contact outside the flexible circuit board. Another aspect of the disclosure provides a specific crimping part for use in the method according to the disclosure. In a further aspect of the disclosure, a connection of, first, a flexible circuit board with, second, a metal contact is provided, and in yet a further aspect a control device is provided, for example, for a motor vehicle, having the connection according to the disclosure.

The method includes that the flexible circuit board is mechanically coupled to an attachment piece. The attachment piece may also to be considered a mounting piece. The attachment piece is consequently attached to the flexible circuit board, or is mounted on the flexible circuit board, respectively. This means that the attachment piece is mounted on the circuit board and is mechanically connected to the contact surface, where the attachment piece does not engage in the flexible circuit board, or is not disposed in a passage of the flexible circuit board, respectively. In other words, the mounting piece is disposed so as to be offset or parallel, respectively, to the flexible circuit board and is connected to the latter. The attachment piece may include a sleeve for receiving a press-fit pin. The internal surface of the press-fit pin may be provided with an (electrically) conductive material which is electrically connected to the contact surface, for example, is electrically connected automatically in the course of the mechanical coupling. The (electrically) conductive material, however, may be electrically connected by way of a dedicated operational step. A press-fit pin of the type described above is guided through the sleeve and a conduit in or on the metal contact. In some examples, the press-fit pin, on account thereof, sits snugly in the sleeve and achieves the electrical contact between the internal surface of the sleeve and the metal contact, and thus also between the contact surface and the metal contact.

The disclosure proceeds from the technologies for contacting contact surfaces on rigid circuit boards, and thus eliminates the disadvantages of methods for contacting such contact surfaces on flexible circuit boards. For example, the attachment piece achieves the necessary space (beyond the region of the thickness of 1.6 mm) and a certain rigidity or stiffness in order for the press-fit pin to be introduced, and ensure a sufficiently positive connection with the metal contact.

The attachment piece in the region of a through hole, or a passage, respectively, in the flexible circuit board may be soldered by way of a robust soldering method (such as, for example, re-flow soldering) to the flexible circuit board (whereby the attachment piece may be connected with the contact surface in an electrically conducting manner, or at least the internal surface of the sleeve may be electrically connected with the contact surface). This means that the attachment piece in the region of the passage and/or of the through hole is disposed and/or mounted on the flexible circuit board and is mechanically connected to the flexible circuit board, where the attachment piece does not protrude into and/or engage in the passage of the flexible circuit board. This is a decisive aspect, since the press-fit pin for fastening the metal contact is in this way guided through the attachment piece and the through hole, where the press-fit pin is braced in relation to the attachment piece and not in relation to the actual flexible circuit board. The press-fit pin in the region of the passage is disposed and/or configured so as to be without contact with the circuit board.

The attachment piece may be a metal sleeve, for example, composed of copper, so that a special coating of the internal surface of the sleeve is not mandatory. The interior of the sleeve may be galvanically or chemically coated with tin in order for the press-fitting forces to be minimized. Further functional layers (OSP—organic surface protection) are likewise possible.

Alternatively, or additionally when contacting other contact surfaces on the same flexible circuit board, the attachment piece may include a support for a rigid circuit board (or a rigid circuit board per se which embodies conductor tracks so as to represent a function according to the disclosure). In the case of a support (not a PCB), a passage having a conductive coating for forming the sleeve is configured. A typical support may include high-temperature plastic materials such as PPA (partially aromatic polyamides), PPS (polyphenylene sulfide), PESU (polyether sulfone), or can also include a thermosetting material such as phenoplastic material or an epoxy. The attachment piece may also have the thickness of a typical rigid circuit board, for example between 1.2 mm and 2 mm.

Instead of soldering on an attachment piece having a sleeve, the attachment piece in the region of a passage in the circuit board may also be laminated thereto, where a metal coating for providing the conductive material is applied to the internal surface of the sleeve after the laminating, to which end, for instance, a galvanic method or a chemical deposition method can be provided in particular for providing a copper coating or tin coating.

The laminated attachment piece may likewise include the material from which a rigid circuit board is typically produced, for instance a glass-fiber-reinforced epoxy resin.

In some examples, contacting other contact surfaces may be provided on the same flexible circuit board on which examples that are already mentioned have been implemented (but they can also alternatively fully take their place), a crimping part is provided as an attachment piece. The crimping part may have a crimping region having at least one crimping plate, and another region having the sleeve. The crimping part may be connected to the flexible circuit board by crimping with the crimping region, where at least one crimping plate contacts the contact surface when crimping. On account thereof, the entire crimping part may also be electrically connected with the contact surface. The sleeve may be disposed beside the periphery of the flexible circuit board, or below or above the latter. In this case, there is a separation between the sleeve and the flexible circuit board; the sleeve, for example, may not mandatorily be provided in the extension of a passage in the flexible circuit board (which would however be likewise possible when crimping), but may ensure contacting at an entirely different location away from the flexible circuit board.

According to a further aspect of the disclosure, the crimping part that is provided for the method is provided having a first region which has a tongue supporting at least one crimping plate, and having a second region which has a passage in which a press-fit pin is receivable. Such crimping parts when assembling a flexible circuit board on a stamped lattice may be gripped very rapidly and may be used for contacting, in particular in the construction of a control device for a transmission.

In some examples, the connection of, first, a flexible circuit board with, second, a metal contact, in particular a metal contact of a stamped plate, is established by way of a press-fit pin, where the connection may be provided by the method according to the disclosure according to one or a plurality of the examples mentioned.

The control device according to the disclosure, which is provided in particular for a (motor) vehicle, for example, for a motor vehicle transmission, has the connection according to the disclosure; a stamped plate or another metal contact having a flexible circuit board which supports an electronic control system for the control device is thus connected by way of a press-fit pin such that the electronic control system may be accessed from outside.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 6a shows a perspective view of an exemplary crimping strip.

FIG. 6b shows a perspective view of the exemplary crimping strip from FIG. 6a after being crimped to the flexible circuit board.

Like reference symbols in the various drawings indicate like elements.

DETAILED DESCRIPTION

Figure 1:
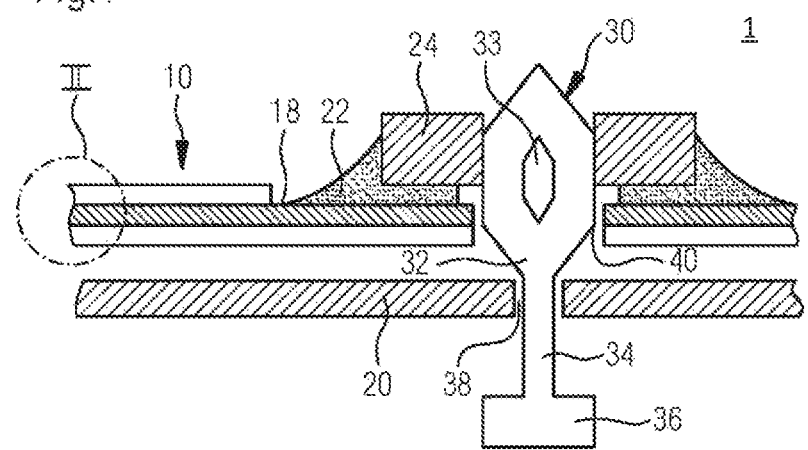
FIG. 1 shows a section through an exemplary connection of a type where a copper sleeve is soldered to the flexible circuit board.
Figure 2:
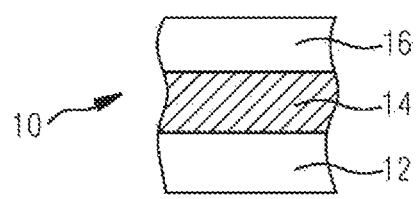
FIG. 2 shows the section II from FIG. 1 in an enlargement, illustrating the construction of the flexible circuit board.

Referring to FIG. 1, a connection includes an electric circuit board which in its entirety is identified by the reference sign 10 and which is electrically and mechanically connected with/to a metal contact of a stamped plate which in its entirety is identified by the reference sign 20. As can be seen in FIG. 2, the flexible circuit board 10 includes a base film 12 from plastics such as PEEK (polyether ether ketone), polyester, polyimide, fluoropolymers, or the like, to which at least one copper conductor track 14 is applied. The copper conductor track 14 in turn being covered by a cover film 16 of, for example, polyethylene terephthalate (PET). In order for the mechanical and electrical connection between the flexible circuit board 10 and the stamped plate 20 to be established, the cover film 16 is partially removed by a soldering procedure, exposing a copper contact surface 18 to which soldering tin or another soft solder 22 is applied to. A copper sleeve 24 is soldered to the flexible circuit board by way of the soft solder 22. The copper sleeve 24 locally may be reinforcing the flexible circuit board and ensuring an overall thickness which is sufficient in order for a press-fit pin 30 to be incorporated. The press-fit pin 30 may have a head 32 in which a cavity 33 is configured, where the head 32 has roughly the shape of a hexagon which is adjoined by a neck 34 which is delimited by a foot 36. In order for the connection to be established, the press-fit pin 30 is guided through a passage 38 in the stamped plate 20 and guided through a suitably stamped passage 40 in the flexible circuit board which clears the way for the head 32 of the press-fit pin 30 into the interior of the sleeve 24.

The press-fit pin 30, per se, establishes the electrical connection between the stamped plate 20 and the sleeve 24, and thus also with the contact surface 18.

Figure 3:
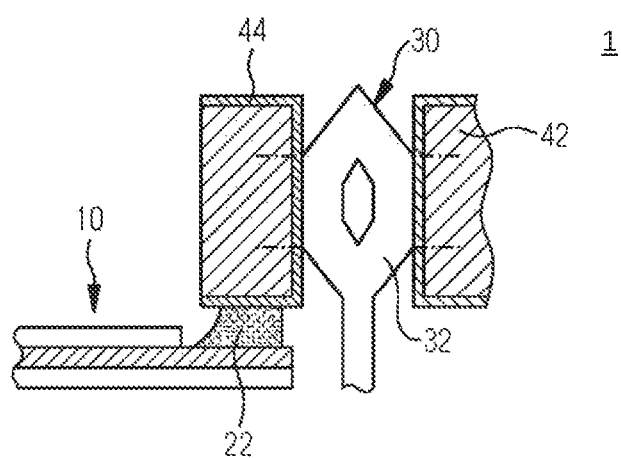
FIG. 3 shows a section through an exemplary connection, where a rigid circuit board is soldered locally to the flexible circuit board in a locally delimited region.

FIG. 3 shows a second exemplary connection in which, instead of a copper sleeve 24, a rigid circuit board 42 having a through hole 44, thus a through contact, from copper, is soldered to or onto the flexible circuit board 10, all other elements remaining identical. The rigid circuit board 42 is restricted to a small region of the flexible circuit boards, for example to the periphery, such that the advantage of the flexibility of the flexible circuit board is maintained.

The through hole 44 establishes the connection between the soft solder 22 and the head 32 of the press-fit pin 30.

Figure 4:
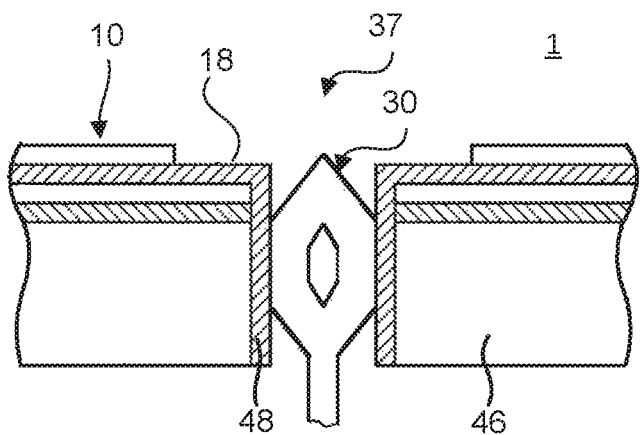
FIG. 4 shows a section through an exemplary connection where a support, such as is used in the case of a flexible circuit board, is laminated thereto locally (thus in a locally delimited region).

Referring to FIG. 4, in some implementations, the typical carrier material for a rigid circuit board is laminated onto the latter in a locally delimited region, or laminated to the flexible circuit board 10, respectively, (see position 46 in FIG. 4), so that a sleeve may be formed in the region of a corresponding passage 37 of the flexible circuit board 10. The laminating may be performed with the aid of a high-temperature method or by cold laminating while using film adhesives.

The passage 37, after the laminating, is provided with the coating 48 of copper, for example by way of a galvanic or chemical deposition method. In chemical/galvanic terms, tin instead of copper may be suitable for the press-fit in the sleeve.

The connection between an electrical contact surface 18 on the flexible circuit board 10 with a stamped plate, which is not shown in FIG. 4 but is provided in a manner analogous to that of FIG. 1, by way of the press-fit pin 30 is thus established.

Figure 5:
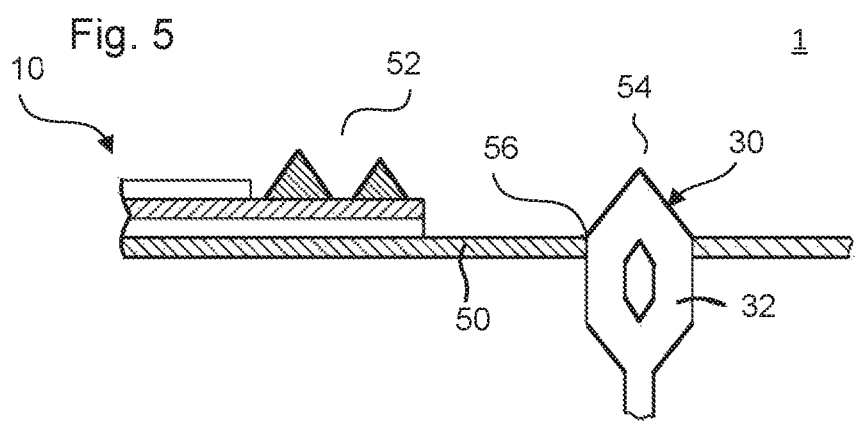
FIG. 5 shows a section through an exemplary connection, where a crimping strip having a sleeve for receiving a press-fit pin, is crimped to the flexible circuit board.

FIG. 5 shows a crimping strip 50 which is connected to the flexible circuit board by crimping in a first region 52, where a sleeve 56 for receiving the head 32 of the press-fit pin 30 is configured in a second region 54.

Crimping strips by the Sumida-Flexcon company, for example, are known; refer to the following link available on Dec. 8, 2016: http://sumida-flexcon.com/hp458/PANTA-FIX-CRIMP.htm.

However, instead of the male or female plug contact, as is usual in the case of such a crimping strip, the sleeve 56 is presently provided (see. FIG. 6a). In the other region, crimping plates 58, 60 which are pressed into the flexible circuit board and thereafter are bent back according to FIG. 6a in order for the crimp-fit to be accomplished are provided. The crimping is performed under the effect of force, according to the arrows 62. The crimping strip is composed of a material which includes sheet metal and may be produced from a piece of sheet-metal.

The connections described here are provided above all for the use in the construction of a control device for a vehicle transmission but can generally also always be established while using the method according to the invention whenever a flexible circuit board is to be electrically contacted with a metal contact outside said flexible circuit board.

A number of implementations have been described. Nevertheless, it will be understood that various modifications may be made without departing from the spirit and scope of the disclosure. Accordingly, other implementations are within the scope of the following claims.

What is claimed is:

1. A control device for a motor vehicle, the control device comprising:
   a flexible circuit board;
   a stamped plate having a metal contact; and
   a press-fit pin, the press-fit pin providing a connection between the flexible circuit board and the metal contact; and an attachment piece comprising a sleeve in which at least part of the press-fit pin is inserted, the attachment piece being mechanically connected to the flexible circuit board, the press-fit pin being electrically connected to the stamped plate.

2. The control device of claim 1, wherein the sleeve comprises a metal composition, the sleeve providing an electrical connection between the press-fit pin and the flexible circuit board.

3. The control device of claim 1, wherein the attachment piece is electrically connected to the stamped plate via the press-fit pin, wherein the connection between the attachment piece and the flexible circuit board comprises a solder connection or a laminate connection.

4. The control device of claim 1, wherein the attachment piece is electrically connected to the stamped plate via the press-fit pin, wherein the attachment piece comprises a crimping part having a first region with one or more crimping plates which extends through one or more through-holes of the flexible circuit board, and a second region having the sleeve through which the press-fit pin is disposed, a distal end of each crimping plate extending through the flexible circuit board and being bent so as to form the mechanical connection with the flexible circuit board.

5. The control device of claim 4, wherein the crimping part provides an electrical connection between the press-fit pin and a contact surface of the flexible circuit board.

6. The control device of claim 1, wherein the attachment piece is electrically connected to the stamped plate via the press-fit pin, the attachment piece comprising a rigid circuit board having a degree of rigidity that is greater than a degree of rigidity of the flexible circuit board.

7. The control device of claim 6, wherein the sleeve comprises a through-hole clad with metal, the press-fit pin being disposed in the through-hole of the rigid circuit board and provides a press-fit connection between the press-fit pin and the rigid circuit board.

8. The control device of claim 7, wherein the metal which clads the through-hole extends along a first surface of the rigid circuit board other than a surface of the through-hole thereof, the mechanical connection between the flexible circuit board and the rigid circuit board comprising a solder connection between the metal along the first surface of the rigid circuit board and the flexible circuit board.

9. The control device of claim 2, wherein the mechanical connection between the attachment piece and the flexible circuit board comprises a solder connection between the sleeve and the flexible circuit board, the press-fit pin extends through the stamped plate and through the flexible circuit board and has a press-fit connection with the sleeve.

10. The control device of claim 1, wherein the attachment piece is electrically connected to the stamped plate via the press-fit pin, wherein the mechanical connection between the attachment piece and the flexible circuit board comprises a laminate connection.

* * * * *